United States Patent [19]

Holonyak, Jr.

[11] 4,439,782
[45] Mar. 27, 1984

[54] SEMICONDUCTOR DEVICE WITH HETEROJUNCTION OF $Al_xGa_{1-x}As$—AlAs—GaAs

[75] Inventor: Nick Holonyak, Jr., Urbana, Ill.

[73] Assignee: University of Illinois Foundation, Champaign-Urbana, Ill.

[21] Appl. No.: 209,240

[22] Filed: Nov. 21, 1980

[51] Int. Cl.³ .............................................. H01L 33/00
[52] U.S. Cl. ......................................... 357/17; 357/4; 357/16
[58] Field of Search ................................ 357/16, 17, 4
[56] References Cited

U.S. PATENT DOCUMENTS

| | | | |
|---|---|---|---|
| 4,220,960 | 9/1980 | Lui et al. | 357/16 |
| 4,257,055 | 3/1981 | Hess | 357/16 |
| 4,270,094 | 5/1981 | Holonyak, Jr. | 357/17 X |
| 4,305,048 | 12/1981 | Copeland | 357/17 X |
| 4,309,670 | 1/1982 | Burnham | 357/17 X |

Primary Examiner—Martin H. Edlow
Attorney, Agent, or Firm—Martin Novack

[57] ABSTRACT

The disclosure is directed to a semiconductor device comprising an active region between a pair of injecting-/collecting layers, the active region comprising at least one layer of a first binary semiconductor material disposed between coupling barriers of a second different binary semiconductor material that is lattice matched to the first binary semiconductor material. In a preferred embodiment the active region comprises one or more layers of gallium arsenide separated by aluminum arsenide barrier layers.

33 Claims, 13 Drawing Figures

SEMICONDUCTOR DEVICE WITH HETEROJUNCTION OF $Al_xGa_{1-x}As$—$AlAs$—$GaAs$

BACKGROUND OF THE INVENTION

This invention relates to improvements in semiconductor devices. The invention is particularly applicable to gallium arsenide/aluminum gallium arsenide heterostructure devices that are useful as light emitters, and can also be used as light detectors or field effect devices.

Various types of semiconductor light emitters are described in the prior art. In a gallium arsenide homojunction light emitter, electrons are injected across a pn junction, combine with holes, and give up excess energy by emitting light at a wavelength characteristic of the material. In a so-called double heterojunction light emitter, fabricated, for example, using a gallium arsenide/aluminum gallium arsenide material system, a pair of relatively wide bandgap layers (aluminum gallium arsenide) of opposite conductivity type are sandwiched around an active region (gallium arsenide). The interfaces between the active region and the wide bandgap layers form a pair of heterojunctions. These heterojunctions effectively provide carrier confinement and optical confinement. The devices are generally used as light emitting diodes or lasers, and may be energized using an electrical current or optical pumping.

There are a number of practical constraints which affect operation and performance of semiconductor light emitting devices. For example, relatively high current densities may be necessary to achieve a desired level of light emission or laser action. Temperature is a significant consideration and, while it is desirable to have devices that work at room temperature, lower temperature operation is often required if continuous operation is desired. The wavelength of the radiation produced is also significant, and is not generally a matter of flexible choice. The wavelength of radiation generated by conventional double heterojunction devices is a function of the bandgap of the active region. Within limits, the wavelength of the radiation produced can be changed by altering the composition of the active region.

Much of the current interest in semiconductor light emitters (especially lasers) is concerned with sources at wavelengths longer than the visible, e.g., $Al_xGa_{1-x}As$-GaAs or $InP$-$In_{1-x}Ga_xP_{1-z}As_z$ double heterostructures. However, certain proposed applications, for example in photocopying or video-disk recording, provide ample reason for interest in visible-spectrum heterostructure lasers. The development of lasers and other light emitters in the visible portion of the spectrum has been limited, however, because of various difficulties in working with high-gap III-V alloys. In the case of high-gap $In_{1-x}Ga_xP_{1-z}As_z$, the substrates employed (commercial GaAsP LED substrates) are not lattice-matched throughout and are of relatively poor quality. For the case of high-gap $Al_xGa_{1-x}As$ there is, in the direct-gap alloy range ($x < x_c \sim 0.45$), a limit to the heterobarrier height or energy-gap discontinuity between the active region and the confining layers.

Visible-spectrum semiconductor lasers have been constructed which employ a GaAs quantum well in an $Al_xGa_{1-x}As$-GaAs device. These quantum-well heterostructures can tend to be relatively inefficient laser sources, however, because of their broad spontaneous spectra and thus wasted recombination. If an attempt is made to effect an improvement in $Al_xGa_{1-x}As$-GaAs quantum well heterojunction devices by shifting the n=1 states (electrons, heavy holes, light holes) to higher energies by reducing the GaAs quantum well size to less than 50 angstrom thickness, multiple wells need be employed to yield a sufficiently large total active region and to collect the injected carriers but, unfortunately, lower-energy recombination and a broad recombination radiation spectrum are still observed.

It is an object of the present invention to improve upon the deficiencies observed in gallium arsenide/aluminum gallium heterostructures and particularly in gallium arsenide/aluminum gallium arsenide quantum well heterostructure devices.

SUMMARY OF THE INVENTION

Lower-energy recombination and broad recombination radiation spectra observed in gallium arsenide/aluminum gallium arsenide quantum well heterostructure devices is largely due to alloy clustering in the aluminum gallium arsenide coupling barriers of the devices. In the present invention applicant has reduced or eliminated the deficiencies caused by the clustering by providing aluminum arsenide barriers. It therefore becomes possible and practical to use very small quantum well sizes (for example, 50 angstroms or less) to generate high energy recombination radiation. In a form of the invention this is done using an active region which has an advantageous configuration of only binary layers of gallium arsenide and aluminum arsenide, thereby eliminating III-V alloy problems.

The present invention is directed to a semiconductor device comprising an active region between a pair of injecting/collecting layers, the active region comprising at least one layer of a first binary semiconductor material disposed between coupling barriers of a second different binary semiconductor material that is lattice matched to the first binary semiconductor material.

In one preferred embodiment of the invention there is provided a semiconductor device comprising a pair of aluminum gallium arsenide injecting/collecting layers having disposed therebetween a layer of gallium arsenide. A pair of barrier layers of aluminum arsenide are respectively disposed at the interfaces between the layer of gallium arsenide and the layers of aluminum gallium arsenide. The barrier layers of aluminum arsenide preferably comprise continuously deposited layers of aluminum arsenide, each having a thickness of at least 10 angstroms.

In a further embodiment of the invention, a pair of aluminum gallium arsenide injecting/collecting layers have disposed therebetween an active region which comprises a plurality of layers of gallium arsenide separated from each other by barrier layers of aluminum arsenide. The gallium arsenide layers comprise quantum well regions.

Further features and advantages of the invention will become more readily apparent from the following detailed description when taken in conjunction with the accompanying drawings.

DESCRIPTION OF THE PREFERRED EMBODIMENTS

Figure 1:
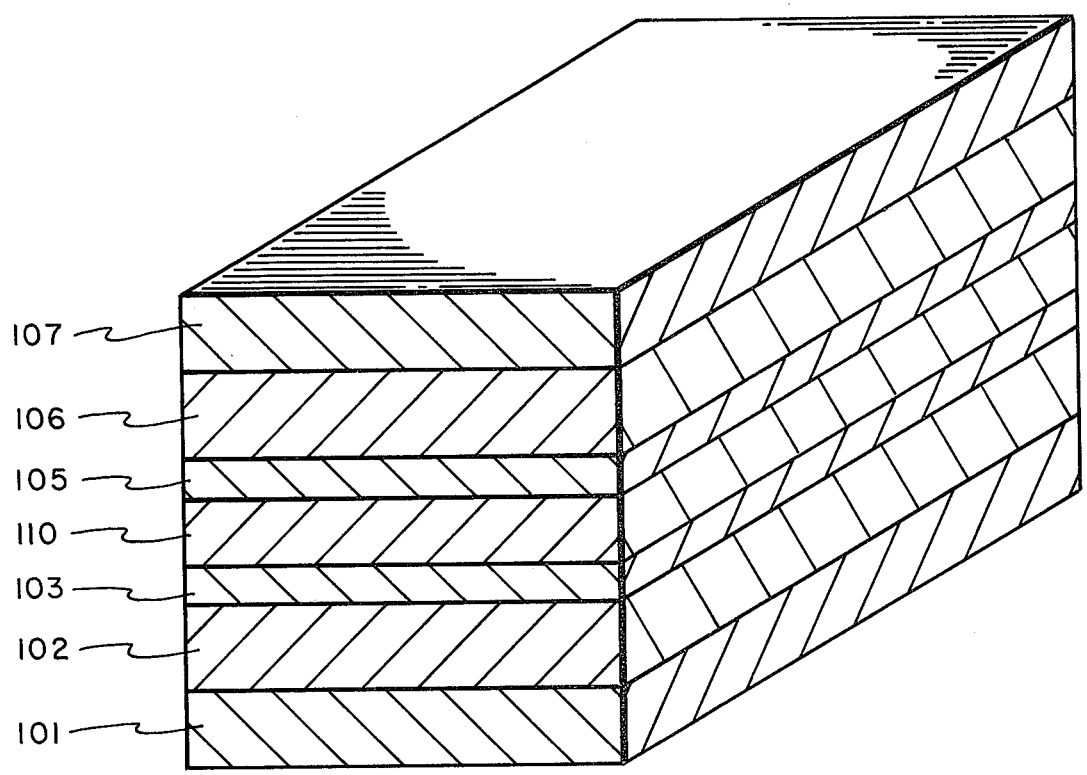
FIG. 1 illustrates a semiconductor heterostructure device in accordance with an embodiment of the invention.

Referring to FIG. 1, there is shown a semiconductor heterostructure device in accordance with an embodiment of the invention. A body 100 includes outer buffer or contact layers 101 and 107, a pair of injecting/collecting (i.e., injecting or collecting) regions 102 and 106 which are preferably, although not necessarily, of opposite conductivity type, a pair of coupling barriers 103 and 105, and a single active layer 110 between coupling barrier layer 102 and 106. The injecting/collecting confining regions 102 and 106 are of a relatively wide bandgap semiconductor material, and the single active layer 110 is of a relatively narrow bandgap binary semiconductor material. The barrier layers 103 and 105 are of a binary semiconductor material that is lattice matched to the active layer material. In a form of the invention the single active layer is a quantum well having a thickness in the range of about 100 to 400 angstroms. The coupling barrier regions should have a thickness of at least about 10 angstroms and preferably be in the range between about 10 and 200 angstroms.

A single quantum well embodiment of the structure of FIG. 1 is as follows:
layer 101: 1 μm GaAs: Se ($n \sim 1 \times 10^{18} cm^{-3}$)
layer 102: 2 μm $Ga_{0.6}Al_{0.4}As$: Se ($n \sim 5 \times 10^{17} cm^{-3}$)
layer 103: 30 angstroms AlAs (doped or undoped)
layer 110: (thickness=$L_z$) GaAs (doped or undoped)
layer 105: 30 angstroms AlAs (doped or undoped)
layer 106: 0.3 μm $Ga_{0.6}Al_{0.4}As$: Zn ($p \sim 2 \times 10^{17} cm^{-3}$)
layer 107: 1 μm GaAs: Zn ($p \sim 2 \times 10^{18} cm^{-3}$)

The device is preferably, although not necessarily, grown by metalorganic chemical vapor deposition ("MO-CVD"), which is described, for example, in a publication entitled "Chemical Vapor Deposition For New Material Applications" that appeared in the June, 1978 issue of Electronic Packaging And Production. The devices herein may also be grown by molecular beam epitaxy, liquid phase epitaxy, or any other suitable deposition technique, although MO-CVD is presently preferred.

The heterostructure of FIG. 1 can be grown using MO-CVD by employing the metal alkyls trimethylgallium (TMGa) and trimethylaluminum (TMAl) as sources of the Group III elements Ga and Al. The hydride $AsH_3$ is used as the source of the Group V element As. $H_2Se$ is used as a source of Se for n-type doping, and diethylzinc (DEZn) is used as a source of Zn for p-type doping. The various layers are grown sequentially at 750° C. on {100} GaAs substrates.

Figure 2:
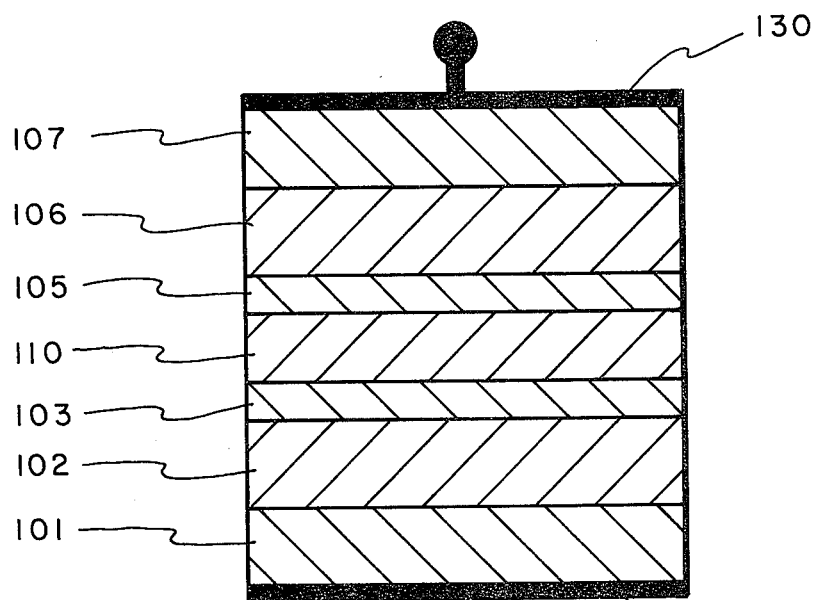
FIG. 2 is a cross-section of a form of the FIG. 1 embodiment prepared as a device with electrodes.

In one use of the structure of FIG. 1, metal electrodes 120 and 130 are deposited on the gallium arsenide layers 101 and 107, the layers 101 and 107 being respectively utilized for providing a damage free growing surface and for contact purposes. Typically, the grown structure is cleaved and sawcut into dice, and then assembled into devices with electrodes, such as diodes or field effect devices (see FIG. 2). When prepared for use as diodes, the aluminum gallium arsenide layers are typically of the same thickness.

Figure 3:
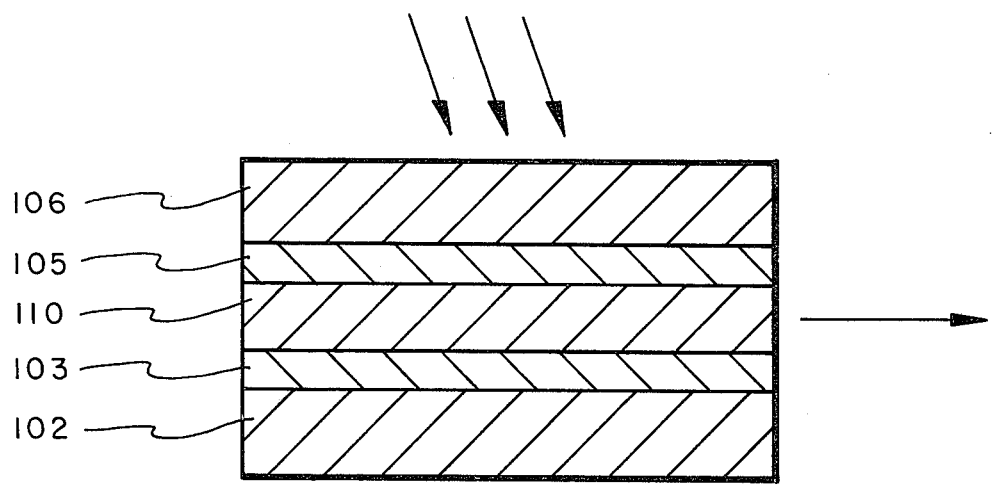
FIG. 3 is a cross-section of a form of the FIG. 1 embodiment prepared for optical excitation.

For optical pumping, the gallium arsenide outer layers are removed by first polishing and then using a selective etch that stops at the aluminum gallium arsenide layers. The resulting device is cleaved into rectangular strips and then can be compressed into an indium or copper heat sink. A diagram of the photopumped structure is illustrated in FIG. 3.

Figure 4:
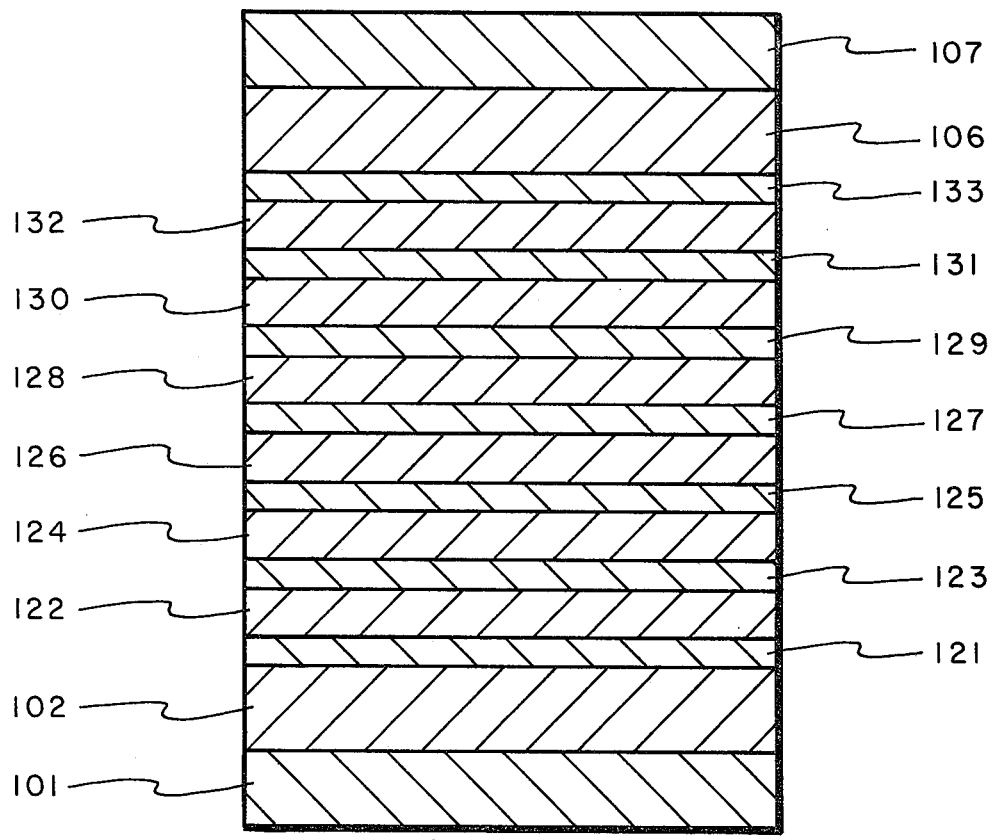
FIG. 4 is a cross-section of another embodiment of the invention which includes multiple quantum layers separated from each other by aluminum arsenide coupling barrier layers.
Figure 5:
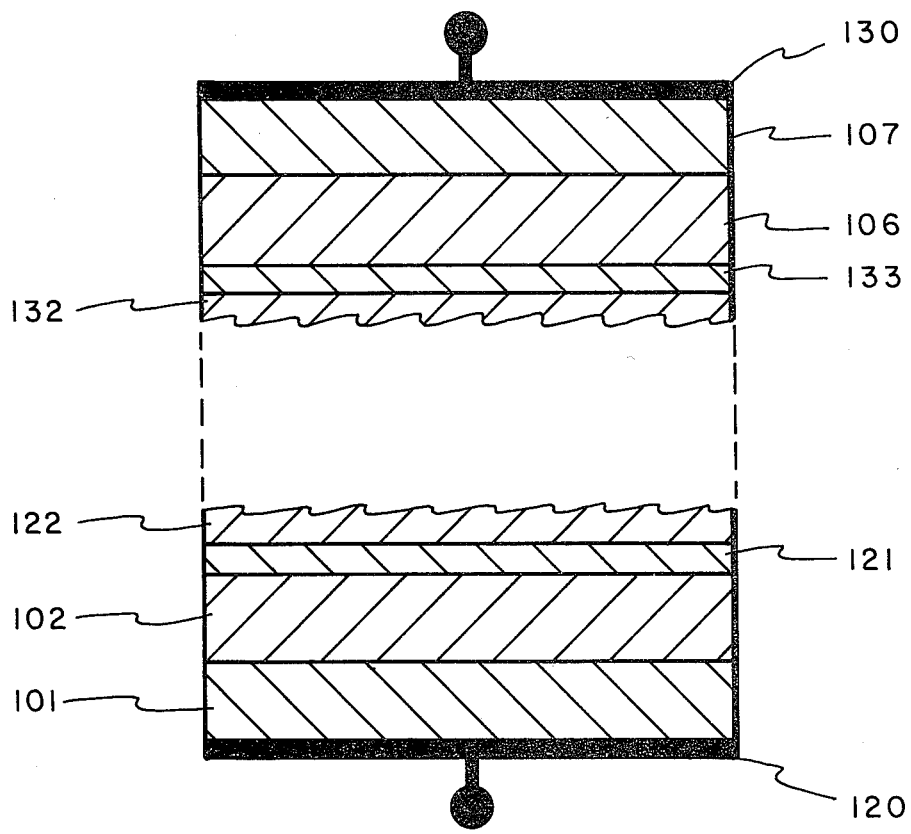
FIG. 5 is a cross-section, partially broken away, of a form of the FIG. 4 embodiment prepared as a device with electrodes.

In the embodiment of FIG. 4, the layers 101, 102, 106 and 107 are representative of their counterparts in FIG. 1, but the active region includes multiple thin gallium arsenide wells (each having a thickness preferably between about 20 and 150 angstroms) separated from each other and from the aluminum gallium arsenide regions by aluminum arsenide coupling barrier layers, each having a thickness preferably in the range of about 10 to 200 angstroms. In the illustration of FIG. 4, there are six gallium arsenide layers, 122, 124, 126, 128, 130 and 132, and seven aluminum arsenide layers, 121, 123, 125, 127, 129, 131 and 133. The structure of FIG. 4 can, for example, be prepared with electrodes (FIG. 5) or for photopumping (FIG. 6) in the manner described in conjunction with FIGS. 2 and 3.

Figure 7:
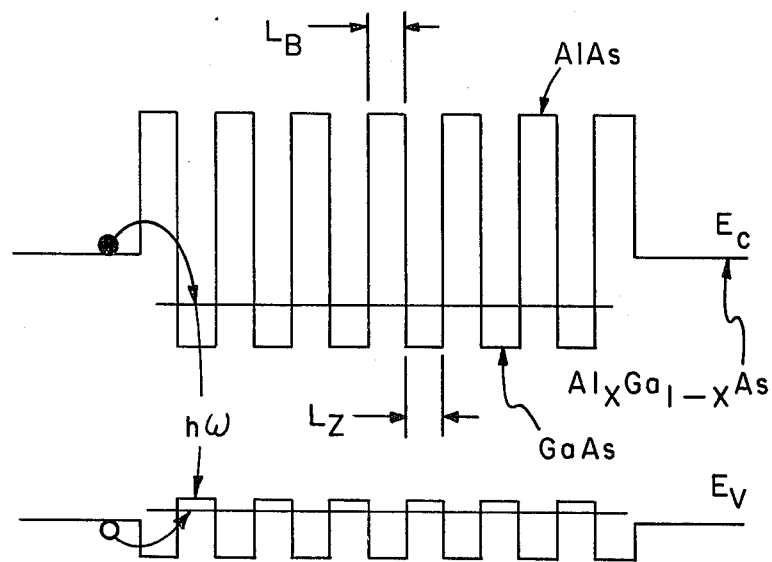
FIG. 7 is a diagram of the conduction and valence bands of an aluminum gallium arsenide—aluminum arsenide—gallium arsenide quantum well heterostructure with an alloy-free active region.

FIg. 7 is a simplified model of the conduction and valence bands of the device of FIG. 4 considered as free of disorder and clustering in the active region. When photopumped, for example, the electrons and holes generated in the confining layers diffuse to the active region where they tunnel and scatter to the lower-energy quantum-well states and recombine (e.g. arrows in FIG. 7). For design and experimental reasons it is important to know the location of the lowest-energy (n=1) electron (e), heavy-hole (hh), and light hole (lh) states or bands of the device. These states can be determined by solving Schrödinger's Equation (for electrons, heavy holes, and light holes) in each layer and by matching the solutions across the boundaries. For devices with only a few wells, the exact number of wells and the composition of the $Al_xGa_{1-x}As$ confining layers have a pronounced effect on the allowed energy states. Beyond about six wells, however, the allowed energy states begin to form energy bands, and a Kronig-Penney analysis (R. de L. Kronig and W. G. Penney, Proc. Roy. Soc (London) A130, 499 (1930)) serves as a useful approximation for calculating the lowest (n=1) electron, heavy-hole, and light-hole energy bands. Although these calculations are not exact, they provide a useful guide for choosing layer thicknesses corresponding to the desired (n=1) e, hh, lh energies.

The n=1 energy bands (FIG. 8) are calculated as a function of well size, $L_z$, for an infinite series of GaAs wells and with the AlAs barriers chosen to be $L_B=20$ angstroms. The Kronig-Penney analysis leads to the familiar expression $$1 \geq |[(\alpha^2-\beta^2)/2\alpha\beta] \sinh(\alpha L_B) \sin(\beta L_z) + \cosh(\alpha L_B) \cos(\beta L_z)|, \quad (1)$$

where
$$\alpha = [2m_1^*(V-1)]^{\frac{1}{2}}/\hbar, \quad (2)$$

and
$$\beta = (2m_2^*E)^{\frac{1}{2}}/\hbar. \quad (3)$$

Equation (1) can be solved for the allowed energies, E, of electrons in the conduction band and holes in the valence band. In the present instance E is the electron energy above the GaAs conduction band edge or the hole energy below the valence band edge (the 0 boundary in FIG. 8). The electron effective mass in the AlAs barriers, $m_1^*$, is taken to be $0.15\ m_o$, where $m_o$ is the free-electron mass. The electron effective mass in GaAs, $m_2^*$, is calculated as a function of energy from $$m_2^* = [0.0665 + 0.0436E + 0.236E^2 - 0.147E^3]m_o, \quad (4)$$

where E is in meV. Equation (4) is employed to take into account, as a first-order approximation, the nonparabolic nature of the $\Gamma$ minimum and the variation of the electron effective mass with E ($E \lesssim 300$ meV). The conduction-band discontinuity or barrier height, V, is taken to be $$V = 0.85\ [E\Gamma(0,T) - E\Gamma(1,T)], \quad (5)$$

where the energy of the $\Gamma$ minimum in $Al_xGa_{1-x}As$ as a function of both crystal composition, x, and temperature, T, is given by $$E\Gamma(x,T) = 1.519 + 1.247x - 5.405 \times 10^{-4} T^2/(T+204) \quad (6a)$$
$$x < 0.45$$

$$= 1.519 + 1.247x + 1.147(x-0.45)^2 - 5.405 \times 10^{-4} T^2/(T+204) \quad (6b)$$
$$x > 0.45.$$

The effective masses used for the heavy holes are $m_1^* = 0.75 m_o$ (AlAs) and $m_2^* = 0.45 m_o$ (GaAs). For light holes, $m_1^* = 0.15 m_o$ (AlAs) and $m_2^* = 0.087 m_o$ (GaAs). The valence-band discontinuity, in agreement with Equation (5), is taken to be $$V = 0.15[E\Gamma(0,T) - E\Gamma(1,T)], \quad (7)$$

where $E\Gamma(x,T)$ is calculated from Equations (6a) and (6b).

Figure 8:
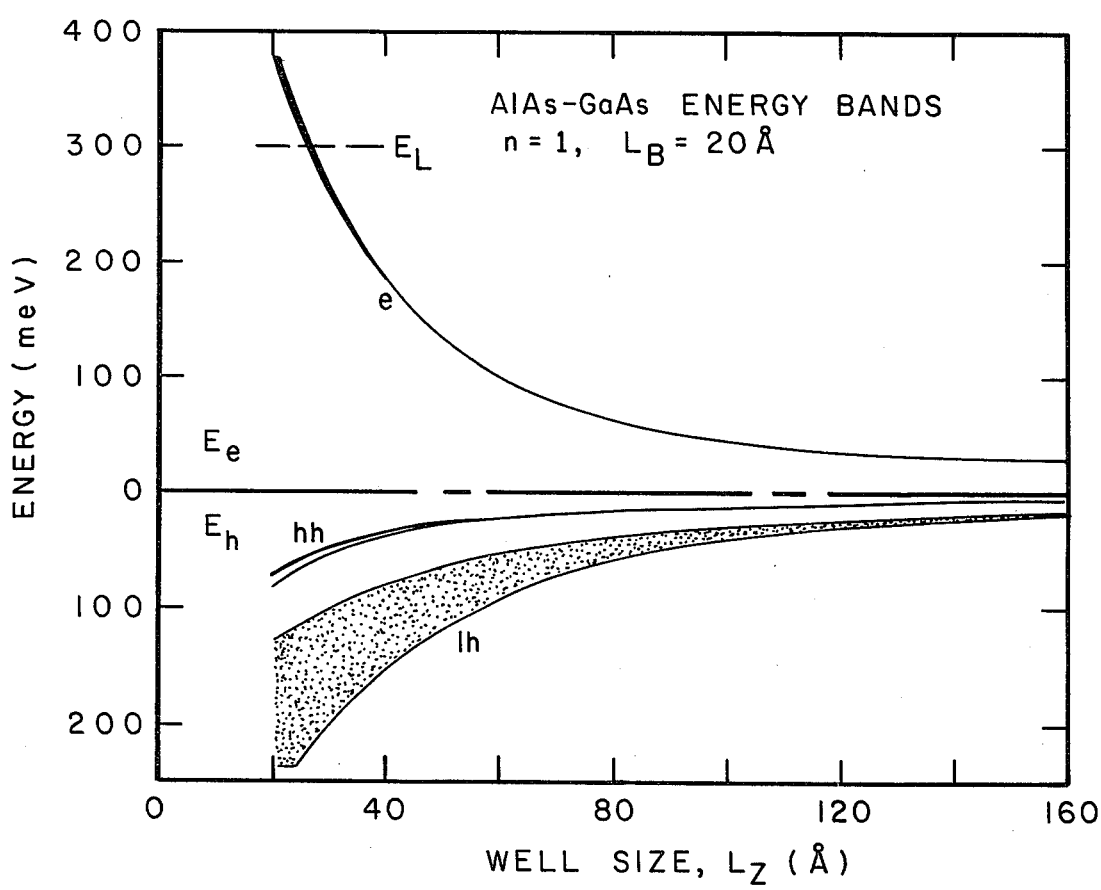
FIG. 8 is a diagram showing the lowest (n=1) confined-particle energy bands for electrons (e), heavy holes (hh), and light holes (lh) as a function of well size $L_z$, for gallium arsenide wells coupled by aluminum arsenide barriers of thickness $L_B=20$.

The electron and heavy-hole energy bands calculated from the above expressions and shown in FIG. 8 are relatively narrow in comparison to the light-hole energy band because of the low effective mass of the light holes and because of the rather small band-edge discontinuity in the valence band. As expected, for barrier widths, $L_B$, smaller than 20 angstroms, the energy bands tend to broaden equally above and below the band centers. Also, for $L_B > 20$ angstroms the bands contract to smaller widths. These effects are demonstrated in subsequent data. It can be noted that for $L_z \lesssim 25$ angstroms ($L_B = 20$ angstroms) the light-hole band extends downward to the "top" of the potential well (~235 meV), which is the upper limit for the hole energy bands. This is the basis for the small horizontal line on the lh band at $L_z \lesssim 25$ angstroms (FIG. 8). In the same size range the electron band, e, extends to $\gtrsim 300$ meV above the bulk-crystal conduction band edge and is somewhere near the GaAs L indirect band edge (D. E. Aspnes and M. Cardona, Phys. Rev. B17, 741 (1979)). This is shown by FIG. 8 by the $E_L$ horizontal marker.

Figure 6:
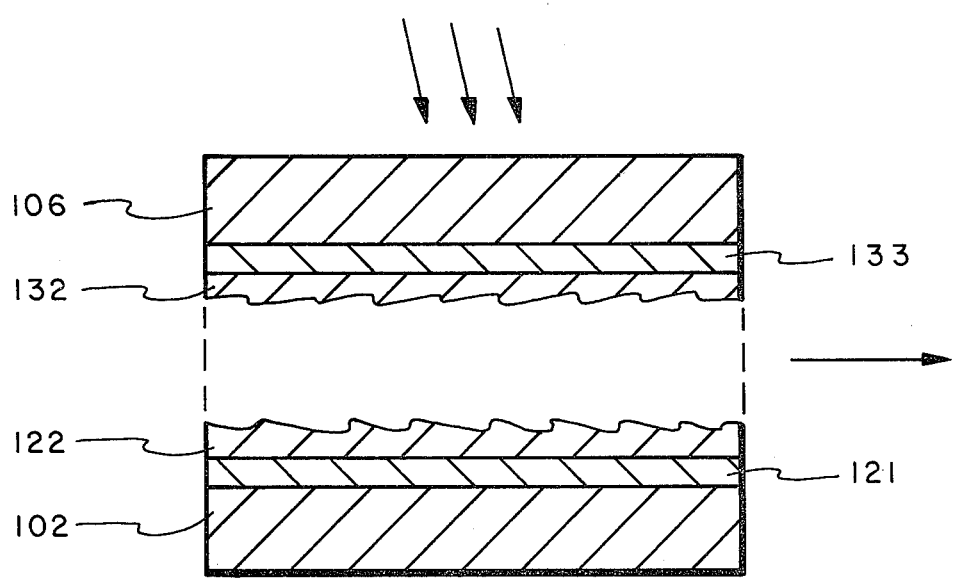
FIG. 6 is a cross-section, partially broken away, of a form of the FIG. 4 embodiment prepared for optical excitation.
Figure 9:
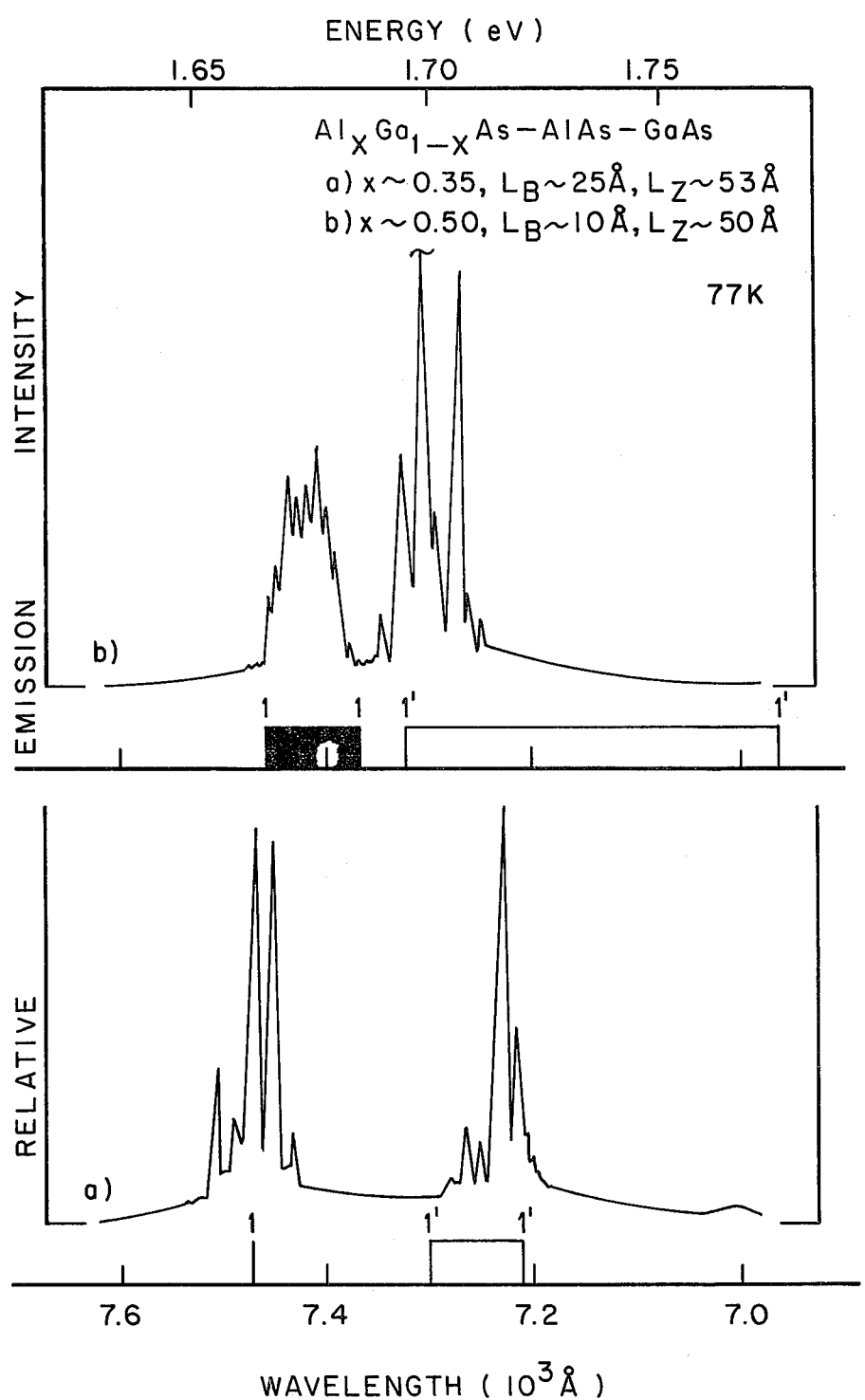
FIG. 9 illustrates photoluminescence spectra of two quantum well heterostructures with active regions having twelve gallium arsenide quantum wells and thirteen aluminum arsenide barriers. The bars on the horizontal axis mark calculated electron-to-heavy-hole and electron-to-light hole transitions.

For the data of FIG. 9, the device of the form of FIG. 6 has twelve gallium arsenide quantum wells and thirteen aluminum arsenide barrier layers. For the two wafers (a) and (b), the well sizes differ slightly and the $Al_xGa_{1-x}As$ confining layer compositions (x) are not the same, but the fundamental difference between the two wafers is their AlAs barrier-layer thicknesses: (a) $L_B \sim 25$ angstroms and (b) $L_B \sim$ angstroms. For the wafer used to obtain the data of FIGS. 10-12, the active region consists of six $L_z \sim 30$ angstroms GaAs quantum wells and five $L_B \sim 50$ angstroms AlAs coupling barrier layers. All of the layers were undoped ($n_d - n_a \leq 10^{15}/cm^3$). Photopumping was with an $Ar^+$ laser ($\lambda \sim 5145$ angstroms) or a dye-tunable laser ($\lambda_p \sim 6540$ angstroms). In the case of the latter, significant absorption occurs only at the GaAs quantum wells; thus the excitation levels necessary to attain laser threshold are typically quite high as compared to the power densities necessary when using an $Ar^+$ laser.

The effect of the AlAs barrier layer thickness on device emission spectra is shown by the photopumped-laser spectra (77 K) of FIG. 9. The laser spectrum of (a) ($8 \times 10^4$ W/cm$^2$) is from a sample with thicker AlAs barriers ($L_B \sim 25$ angstroms), while that of (b) ($8 \times 10^5$ W/cm$^2$, $\lambda_p \sim 6540$ angstroms, only the quantum wells excited) is from a sample with thinner AlAs barriers ($L_B \sim 10$ angstroms). This difference in well-coupling is reflected (FIG. 9) in the energy spread, (a) narrower and (b) broader, of the n=1 electron-to-heavy-hole (e→hh) and n'=1' electron-to-light-hole (e→lh) transitions. The laser operation in both cases occurs at the lower-energy end of the n=1 (e→lh) bands, as is evident in FIG. 9. These data illustrate the effect of the size of $L_B$.

Typical 77 K photoluminescence spectra of a sample cleaved from the six well wafer described above are shown in FIG. 10. Because of the form of the device active region, the confined-carrier states and thus the transitions are slightly modified from those typical of wafers of the form of FIG. 7. The potential barrier formed by a ~50 angstrom thick AlAs layer has a relatively large effect in localizing carriers in the GaAs layers. Because of this, the confined carriers in the two outermost GaAs quantum wells are in asymmetric potential wells with a lower-energy $Al_xGa_{1-x}As$ (x~0.5) barrier on one side and a higher-energy AlAs barrier on the other; the confined carriers in each of the remaining four GaAs quantum wells are in a symmetric potential formed by two higher-energy AlAs barriers. Therefore, two of the lowest-energy confined-carrier states (there are six n=1 confined-carrier states for a six well heterostructure) are nearly degenerate and characteristic of the outermost GaAs layers. These states are somewhat lower in energy than the remaining four nearly degenerate states characteristic of the four inner GaAs wells. The energy of these states is approximated rather well by FIG. 8. The resulting recombination transitions corresponding to these states are labeled in FIG. 10 as $l_2$ for the two lower-energy e→hh transitions, $l_4$ for the 4 higher-energy e→hh transitions, and $l_2'$ for the two lower-energy e→lh transitions. The other 4 e→lh transitions are not allowed since only the first two light-hole states are bound in the well. The locations of these transitions in FIG. 10 have been determined by calculation, as described above, and have not been simply estimated from FIG. 8.

Figure 10:
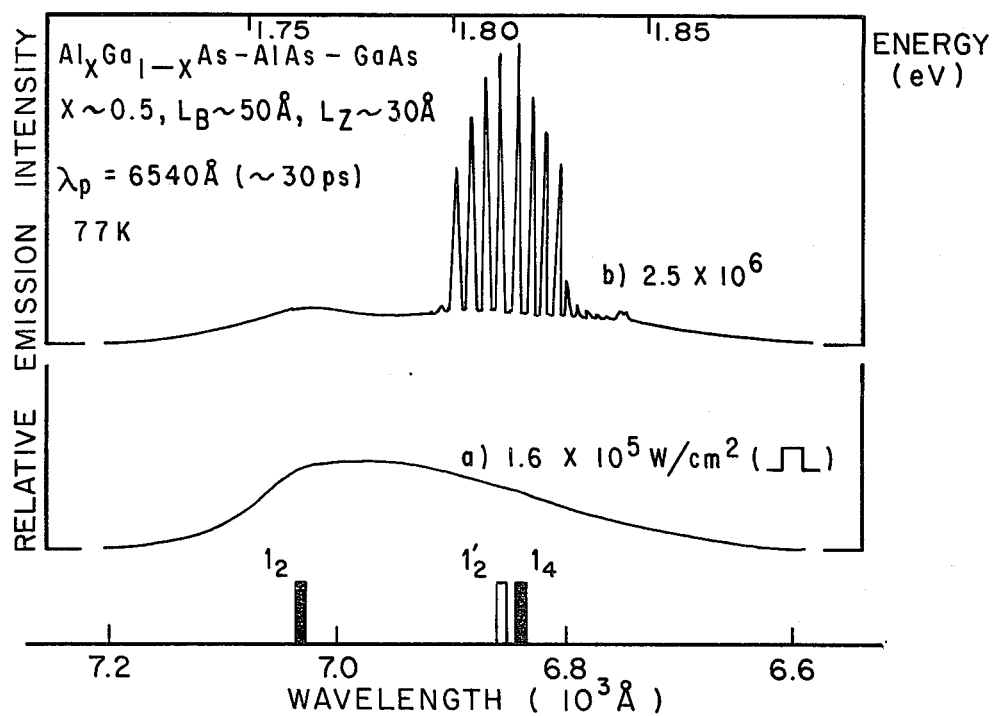
FIG. 10 illustrates emission spectra of a quantum well heterostructure including six gallium arsenide wells coupled by five aluminum arsenide barriers.
Figure 11:
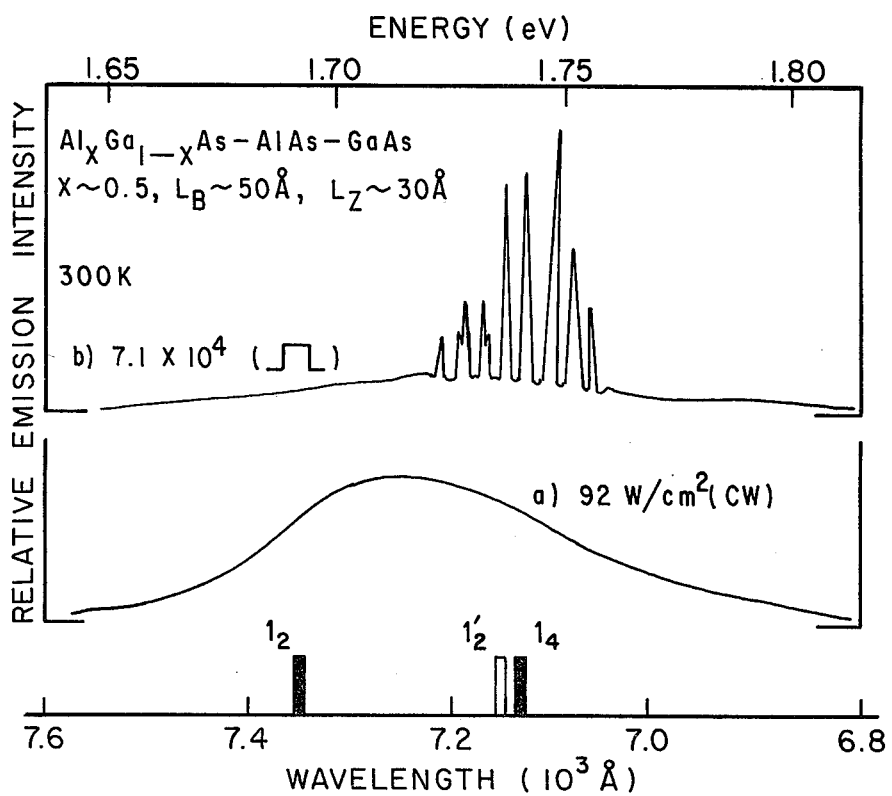
FIG. 11 illustrates room temperature emission spectra of a quantum well heterostructure/similar to the one utilized in obtaining the spectra of FIG. 10.
Figure 12:
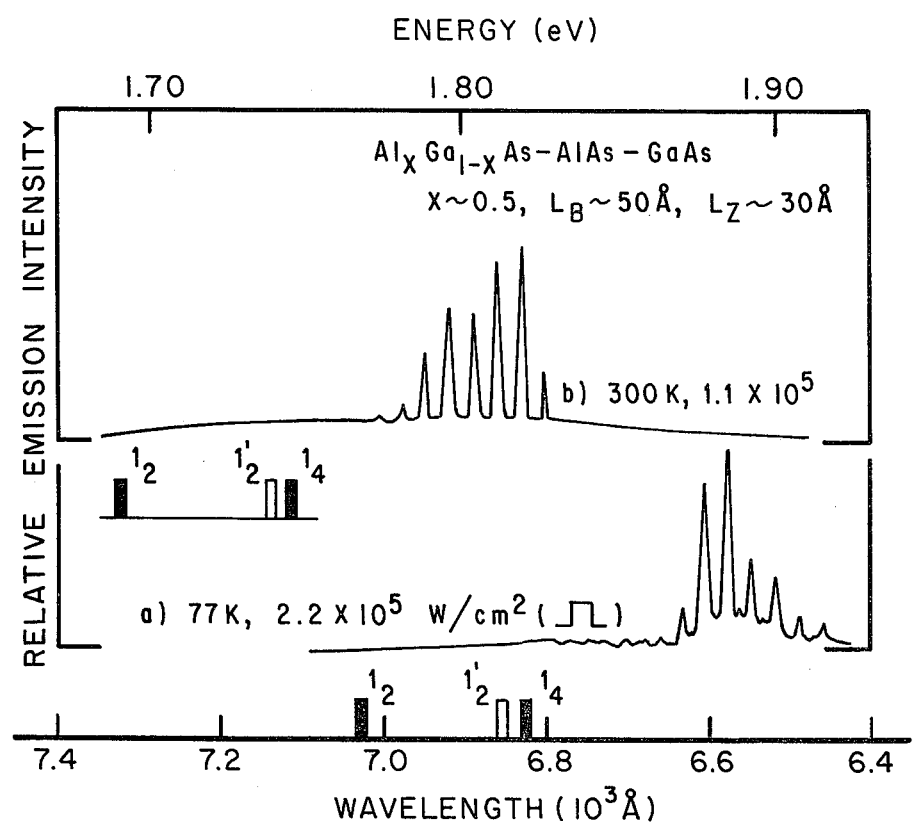
FIG. 12 illustrates emission spectra of another quantum well heterostructure similar to the one used to obtain the spectra of FIGS. 10 and 11.

The emission spectra (77 K) of FIG. 10, as in the case of FIG. 9(b), are obtained by photoexciting with a dye-tunable laser (~30 psec pulse width). The energy gap of the $Al_xGa_{1-x}As$ (x~0.5) confining layers is $E_g$~2.07 eV while the pump-beam photon energy ($\lambda_p$~6540 angstroms) is $\hbar\omega_p$~1.90 eV, or ~170 meV (~25kT) lower in energy. Thus, as already mentioned, the excitation occurs only at the GaAs wells and is quite high. At a photo-excitation level of $1.6 \times 10^5$ W/cm² (curve a), the spontaneous-emission spectrum of this sample peaks very near the n=$l_2$ e→hh transition and exhibits a high-energy tail in the range of the n'=$l_2'$ e→lh and n=$l_4$ e→hh transitions. Upon increase in excitation level to $2.5 \times 10^6$ W/cm² (curve b), laser operation occurs in the energy range of the n'=$l_2'$ e→lh and n=$l_4$ e→hh transitions. Note, however, that a small spontaneous emission peak still exists near n=$l_2$ but not lower in energy as in quantum well heterostructures with disordered ternary coupling barriers. This device exhibits similar behavior at 300 K. FIG. 11 shows the room-temperature emission spectra of another sample cleaved from the same wafer as that described in conjunction with FIG. 10. With low-level CW excitation using an Ar+ laser pump (a, 92 W/cm²), spontaneous emission occurs, as described above, in the energy range of the confined-carrier transitions and not at lower energy. When excited with a cavity-dumped Ar+ laser ($7.1 \times 10^4$ W/cm², b), the same sample lases near the n'=$l_2'$ e→lh and n=$l_4$ e→hh transitions.

A feature of both FIGS. 10 and 11 (77 and 300 K) is that the spontaneous-emission spectra peak near the n=$l_2$ transitions while laser operation occurs near the n'=$l_2'$ and n=$l_4$ transitions. These higher-energy confined-carrier transitions represent a larger density of states and thus are expected to have more gain than the n=$l_2$ e→hh transitions. From the data of FIGS. 10 and 11, it appears that bandfilling to a higher density of states for laser operation to occur is necessary in a structure of this type. This may simply be a consequence of the small active volume of GaAs (6×30 angstroms=180 angstroms).

Figure 13:
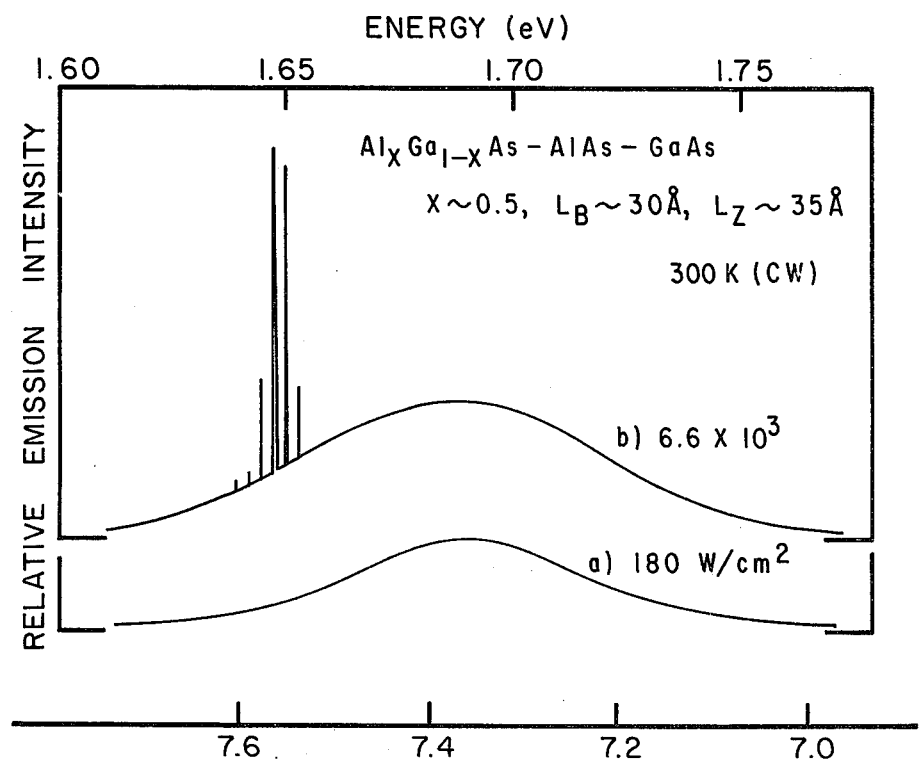
FIG. 13 illustrates emission spectra of a quantum well heterostructure with an active region having seven gallium arsenide quantum wells and eight aluminum arsenide barrier layers.

By selectively exciting very narrow samples (sample widths ~20 μm), with correspondingly high cavity end losses, laser operation can be forced to still higher energies than those shown in FIGS. 10 and 11. This is demonstrated by the 77 and 300 K laser spectra of FIG. 12. At 77 K (a, $2.2 \times 10^5$ W/cm²), a 20 μm wide sample, when pulse-excited with a cavity-dumped Ar+ laser, exhibits laser modes peaked near ~6570 angstroms with a high-energy mode at ~6440 angstroms. Room temperature laser operation (b, $1.1 \times 10^5$ W/cm², sample width ~20 μm) is peaked at 6850 angstroms with a high energy mode at 6800 angstroms. FIG. 13 illustrates performance of a structure having seven GaAs quantum wells ($L_z$~35 angstroms) and eight AlAs barrier layers ($L_B$~30 angstroms). Curve (a) illustrates spontaneous emission from argon laser continuous pumping at 180 W/cm² and curve (b) illustrates laser emission from pumping at $6.6 \times 10^3$ W/cm².

FIG. 13 is particularly significant in that the stimulated emission of (b) is in the red portion of the visible spectrum and is the highest energy (shortest wavelength) laser emission from a GaAs quantum well active layer that, to applicant's knowledge, has been obtained at room-temperature continuous wave operation.

I claim:

1. A semiconductor device, comprising a pair of aluminum gallium arsenide injecting/collecting layers having disposed therebetween a layer of gallium arsenide; and a pair of barrier layers of aluminum arsenide respectively disposed at the interfaces between the layer of gallium arsenide and the layers of aluminum gallium arsenide.

2. The device as defined in claim 1 wherein said barrier layers of aluminum arsenide comprise continuously deposited layers of aluminum arsenide having a thickness of at least about 10 angstroms.

3. The device as defined by claim 2 wherein said barrier layers of aluminum arsenide have a thickness between about 10 angstroms and 200 angstroms.

4. The device as defined by claim 1 wherein said gallium arsenide layer comprises a quantum well having a thickness between about 100 angstroms and 400 angstroms.

5. The device as defined by claim 2 wherein said gallium arsenide layer comprises a quantum well having a thickness between about 100 angstroms and 400 angstroms.

6. The device as defined by claim 3 wherein said gallium arsenide layer comprises a quantum well having a thickness between about 100 angstroms and 400 angstroms.

7. The system as defined by claim 1 further comprising a pair of outer layers of gallium arsenide disposed on said layers of aluminum gallium arsenide.

8. The system as defined by claim 3 further comprising a pair of outer layers of gallium arsenide disposed on said layers of aluminum gallium arsenide.

9. The system as defined by claim 4 further comprising a pair of outer layers of gallium arsenide disposed on said layers of aluminum gallium arsenide.

10. The system as defined by claim 6 further comprising a pair of outer layers of gallium arsenide disposed on said layers of aluminum gallium arsenide.

11. The device as defined by claim 7 further comprising a pair of electrodes disposed on said outer layers of gallium arsenide.

12. The device as defined by claim 8 further comprising a pair of electrodes disposed on said outer layers of gallium arsenide.

13. The device as defined by claim 10 further comprising a pair of electrodes disposed on said outer layers of gallium arsenide.

14. A semiconductor device, comprising a pair of aluminum gallium arsenide injecting/collecting layers having disposed therebetween an active region; said active region comprising a plurality of layers of gallium arsenide separated from each other by barrier layers of aluminum arsenide.

15. The device as defined by claim 14 wherein said barrier layers of aluminum arsenide comprise continuously deposited layers of aluminum arsenide having a thickness of at least about 10 angstroms.

16. The device as defined by claim 15 wherein said barrier layers of aluminum arsenide have a thickness between about 10 angstroms and 200 angstroms.

17. The device as defined by claim 14 wherein said gallium arsenide layers comprise quantum well regions.

18. The device as defined by claim 15 wherein said gallium arsenide layers comprise quantum well regions.

19. The device as defined by claim 16 wherein said gallium arsenide layers comprise quantum well regions.

20. The system as defined by claim 14 further comprising a pair of outer layers of gallium arsenide disposed on said layers of aluminum gallium arsenide.

21. The system as defined by claim 16 further comprising a pair of outer layers of gallium arsenide disposed on said layers of aluminum gallium arsenide.

22. The system as defined by claim 17 further comprising a pair of outer layers of gallium arsenide disposed on said layers of aluminum gallium arsenide.

23. The system as defined by claim 19 further comprising a pair of outer layers of gallium arsenide disposed on said layers of aluminum gallium arsenide.

24. The device as defined by claim 14 further comprising a pair of electrodes disposed on said outer layers of gallium arsenide.

25. The device as defined by claim 16 further comprising a pair of electrodes disposed on said outer layers of gallium arsenide.

26. The device as defined by claim 19 further comprising a pair of electrodes disposed on said outer layers of gallium arsenide.

27. The device as defined by claim 14 wherein said plurality of layers of gallium arsenide in said active region comprise at least six layers of gallium arsenide.

28. The device as defined by claim 16 wherein said plurality of layers of gallium arsenide in said active region comprise at least six layers of gallium arsenide.

29. The device as defined by claim 19 wherein said plurality of layers of gallium arsenide in said active region comprise at least six layers of gallium arsenide.

30. A semiconductor device comprising an active region between a pair of injecting/collecting layers, said active region comprising at least one layer of a first binary semiconductor material disposed between coupling barriers of a second different binary semiconductor material that is lattice matched to the first binary semiconductor material.

31. The device as defined by claim 30 wherein said at least one layer comprises one or more quantum well regions.

32. The device as defined by claim 30 wherein said coupling barriers have a thickness in the range of about 10 to 200 angstroms.

33. The device as defined by claim 31 wherein said coupling barriers have a thickness in the range of about 10 to 200 angstroms.

* * * * *

UNITED STATES PATENT AND TRADEMARK OFFICE
CERTIFICATE OF CORRECTION

PATENT NO. : 4,439,782
DATED : March 27, 1984
INVENTOR(S) : Nick Holonyak, Jr.

It is certified that error appears in the above-identified patent and that said Letters Patent is hereby corrected as shown below:

The term of this patent subsequent to April 27, 1999 has been disclaimed.

Signed and Sealed this

Twenty-second Day of May 1984

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,439,782
DATED : March 27, 1984
INVENTOR(S) : Nick Holonyak, Jr.

It is certified that error appears in the above-identified patent and that said Letters Patent is hereby corrected as shown below:

The term of this patent subsequent to April 27, 2000 has been disclaimed.

This certificate supersedes Certificate of correction issued May 22, 1984.

Signed and Sealed this

Fourteenth Day of August 1984

[SEAL]

Attest:

Attesting Officer

GERALD J. MOSSINGHOFF

Commissioner of Patents and Trademarks